United States Patent
Yamamoto

(10) Patent No.: US 6,573,638 B1
(45) Date of Patent: Jun. 3, 2003

(54) PIEZOELECTRIC CERAMIC TRANSFORMER AND DRIVING METHOD THEREFOR

(75) Inventor: Mitsuru Yamamoto, Tokyo (JP)

(73) Assignee: NEC Corporation, Tokyo (JP)

(*) Notice: Subject to any disclaimer, the term of this patent is extended or adjusted under 35 U.S.C. 154(b) by 665 days.

(21) Appl. No.: 09/016,304

(22) Filed: Jan. 30, 1998

(30) Foreign Application Priority Data

Jan. 31, 1997 (JP) .............................................. 9-018573

(51) Int. Cl.⁷ ................................................ H01L 41/08
(52) U.S. Cl. ........................................ 310/359; 310/366
(58) Field of Search .................. 310/359, 365, 310/366

(56) References Cited

U.S. PATENT DOCUMENTS

| | | | |
|---|---|---|---|
| 3,610,969 A | * 10/1971 | Clawson et al. | ............ 310/314 |
| 4,564,782 A | * 1/1986 | Ogawa | ........................ 310/359 |
| 5,118,982 A | * 6/1992 | Inoue et al. | ................ 310/366 |
| 5,278,471 A | * 1/1994 | Uehara et al. | .............. 310/366 |
| 5,329,200 A | * 7/1994 | Zaitsu | ........................ 310/316 |
| 5,757,106 A | * 5/1998 | Sato et al. | ................... 310/359 |
| 5,828,160 A | * 10/1998 | Sugishita | .................... 310/366 |
| 5,861,704 A | * 1/1999 | Kitami et al. | ............... 310/366 |

FOREIGN PATENT DOCUMENTS

| | | |
|---|---|---|
| JP | 4167504 | 6/1992 |
| JP | 4338685 | 11/1992 |
| JP | 567819 | 3/1993 |
| JP | H8-153914 | 6/1996 |

* cited by examiner

Primary Examiner—Thomas M. Dougherty
(74) Attorney, Agent, or Firm—Sughrue Mion, PLLC

(57) ABSTRACT

A piezoelectric ceramic transformer has a general shape of a disk and is divided in a thickness direction into a generating part and a driving part or symmetrically into a generating part, a driving part and another generating part or into a driving part, a generating part and another driving part. Each of the parts has a layering structure wherein layers are polarized alternately in the thickness direction, and inner electrodes are drawn around from side end faces to main surfaces through outer electrodes and electronic terminals are led out from locations in the proximity of the centers of main surfaces which coincide with nodes of vibrations. In operation, a basic mode of radial direction expansion vibrations is utilized. When a voltage is applied to a driving side electronic terminal in a frequency of a vibration basic mode, the driving part vibrates in a $k_r$ mode which relies upon electromechanical coupling coefficient $k_r$. The vibrations are simultaneously transmitted to the generating side, in which they are converted into electric energy in a high efficiency which relies upon $k_r$. Similar characteristics are obtained also where the piezoelectric ceramic plate is formed of a square shape.

8 Claims, 7 Drawing Sheets

US 6,573,638 B1

PIEZOELECTRIC CERAMIC TRANSFORMER AND DRIVING METHOD THEREFOR

BACKGROUND OF THE INVENTION

1. Field of the Invention

This invention relates to a voltage transformation device for a power supply circuit which is small in size and for which power transmission of a high efficiency is required and a driving method for the voltage transformation device.

2. Description of the Related Art

Conventionally, as a piezoelectric ceramic transformer which makes use of radial direction expansion vibrations of a disk, piezoelectric ceramic transformers disclosed in Japanese Patent Laid-Open Application No. 167504/92, Japanese Patent Laid-Open Application No. 338685/92 and Japanese Patent Laid-Open Application No. 67819/93 are known. Generally, those piezoelectric ceramic transformers positively make use of a radial direction expansion vibration of the third order mode of a disk as seen in FIGS. 1(a), 1(b) and 1(c) and operate in a high frequency band of 500 kHz or more. FIG. 1(a) is a plan view of a piezoelectric ceramic transformer, FIG. 1(b) is a sectional view taken along line A–A' of FIG. 1(a), and FIG. 1(c) is a sectional view taken along line B–B' of FIG. 1(a). The piezoelectric ceramic transformer of the present conventional example includes high impedance part 72 having inner electrodes 74 opposing each other in a thickness direction at a central portion of a piezoelectric ceramic disk, insulating annular part 70 with no electrodes provided on the outer side of high impedance part 72 and low impedance part 71 having a plurality of pairs of inner electrodes 73 provided on the outer side of insulating annular part 70 and opposing each other in the thickness direction. One end of each of inner electrodes 74 of high impedance part 72 is exposed to a side end face of the piezoelectric ceramic disk without contacting with inner electrodes 73 of low impedance part 71, and every other ones of the ends of inner electrodes 74 are connected to each other by outer electrodes 79 and 79', which are connected to electronic terminals 75 and 75', respectively. Meanwhile, one end of each of inner electrodes 73 of low impedance part 71 is exposed to the side end face of the piezoelectric ceramic disk, and every other ones of the ends of inner electrodes 73 are connected to each other on the side end face by outer electrodes 78 and 78'. Further, outer electrodes 78 and 78' are connected to electronic terminals 76 and 76', respectively.

In the present example, high impedance part 72 is formed at the central portion of the disk while low impedance part 71 is formed at the peripheral portion of the disk, and in order to positively utilize a radial direction expansion vibration of the third order mode, inner electrodes 73 and 74 are formed such that they are individually centered at nodes of the vibrations of the radial direction expansion vibration of the third order mode.

In the present example, however, while the radial direction expansion vibration of the third order mode can be excited positively, it is impossible to intensely excite a radial direction expansion vibration basic mode, which is a vibration mode having a high effective electromechanical coupling coefficient and in which the disk is expanded and contracted uniformly. Further, where the piezoelectric ceramic transformer described above is applied to an AC adapter, since it is required that it operate in a frequency band lower than 150 kHz, there is a drawback that the piezoelectric ceramic transformer which operates in the radial direction expansion vibration of the third order mode inevitably makes the size of the transformer large.

SUMMARY OF THE INVENTION

It is an object of the present invention to provide a piezoelectric ceramic transformer of a small size which is high in energy conversion efficiency and operates in a low frequency band lower than 150 kHz.

A piezoelectric ceramic transformer according to the present invention is formed from a piezoelectric ceramic plate having an outer shape of a disk, and the piezoelectric plate is divided, where circular surfaces of the piezoelectric ceramic plate are defined as principal surfaces, in a thickness direction into two regions parallel to the principal surfaces and one of the two regions is formed as a driving part while the other region is formed as a generating part. Each of the driving part and the generating part forms a layering structure as a whole which comprises a plurality of inner electrode pairs formed in parallel to the principal surfaces and opposing each.other in the thickness direction and regions between the inner electrodes, and the regions between the inner electrodes are polarized so that any adjacent ones of the inner electrodes may have opposite polarization directions to each other. Further, an intermediate region between the driving part and the generating part is set as a non-polarized insulating layer. Furthermore, the inner electrodes which oppose each other are partially exposed to different side end faces of the piezoelectric ceramic plate so that the polarities thereof may be opposite to each other and are alternately connected to each other by outer electrodes and further connected to respective electronic terminals.

In a piezoelectric ceramic transformer of another form of the present invention, the piezoelectric ceramic plate is divided, where circular surfaces of the piezoelectric ceramic plate are defined as principal surfaces, in a thickness direction into three regions parallel to the principal surfaces and each having a symmetrical structure with respect to a center sectional plane and a central one of the three regions is formed as either a driving part or a generating part while the regions on the opposite sides of the central region are formed as either generating parts or driving parts different from that of the central region. Each of the driving part or parts and the generating parts or part forms a layering structure as a whole which comprises a plurality of inner electrode pairs formed in parallel to the main surfaces and opposing each other in the thickness direction and regions between the inner electrodes, and the regions between the inner electrodes are polarized such that any adjacent ones of the inner electrodes may have opposite polarization directions to each other. Further, intermediate regions between the driving part or parts and the generating parts or part are set as non-polarized insulating layers. Furthermore, the inner electrodes which oppose each other are partially exposed to different side end faces of the piezoelectric ceramic plate such that the polarities thereof may be opposite to each other and are alternately connected to each other by outer electrodes and further connected to respective electronic terminals.

Each of the piezoelectric ceramic transformers described above can be constructed in a similar manner using a square piezoelectric ceramic plate in place of the circular piezoelectric ceramic plate. Further, the outer electrodes fitted on the side end faces may be individually led out to locations in the proximity of the centers of the top and bottom principal surfaces of the piezoelectric porcelain plate, and electric leads may be led out from the locations. Here, in order to allow the piezoelectric ceramic transformer to operate in a radial direction (where a disk is used) or contour direction (where a square plate is used) expansion vibration basic mode, not the side end faces where antinodes of vibrations appear, but the locations in the proximity of the centers of the top and bottom principal surfaces where an influence of vibrations is comparatively little are selected as the locations from which the electric leads are to be led out.

Each of the piezoelectric ceramic transformers described above utilizes, when it is driven, a radial or contour direction expansion vibration basic mode which provides a high electromechanical coupling coefficient. This augments the power transmission efficiency of the piezoelectric ceramic transformer comparing with those of conventional piezoelectric ceramic transformers and allows further miniaturization of a piezoelectric ceramic transformer device.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 4A:
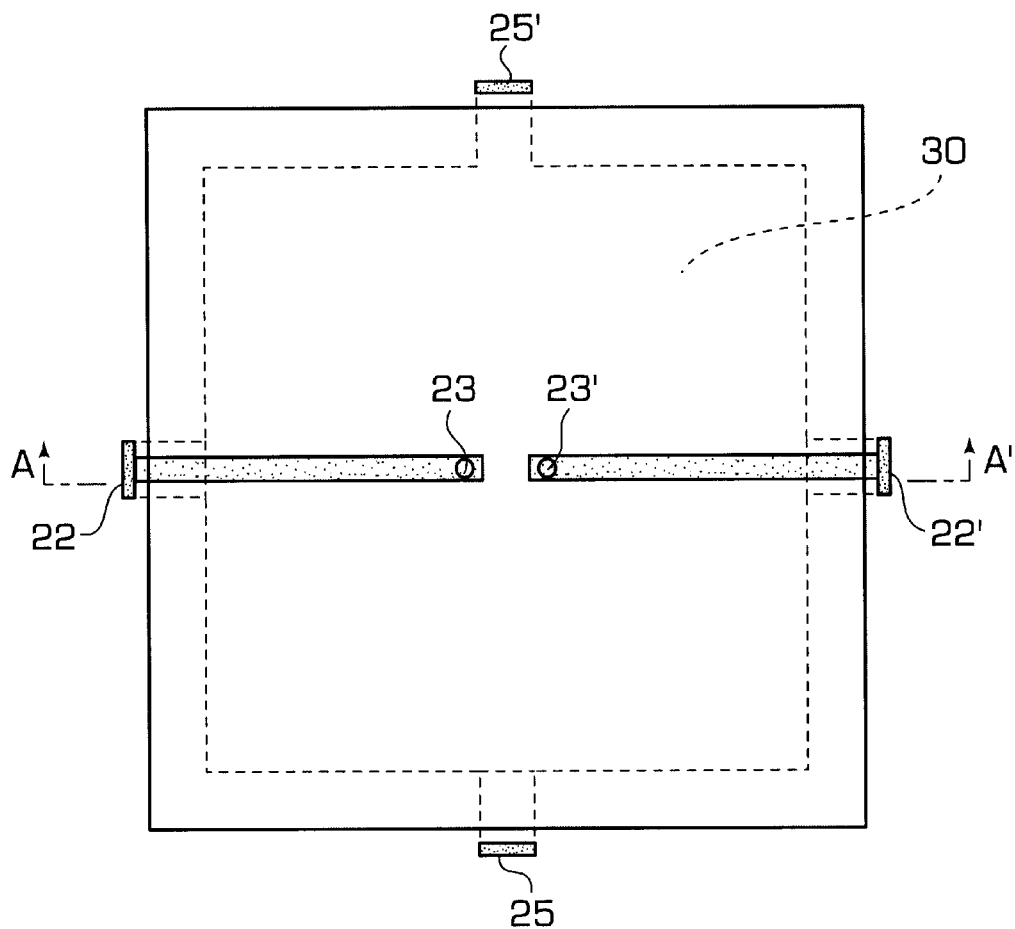
FIGS. 4(a) and 4(b) are a plan view and a sectional view, respectively, showing a piezoelectric ceramic transformer according to Embodiment 2.
Figure 4B:
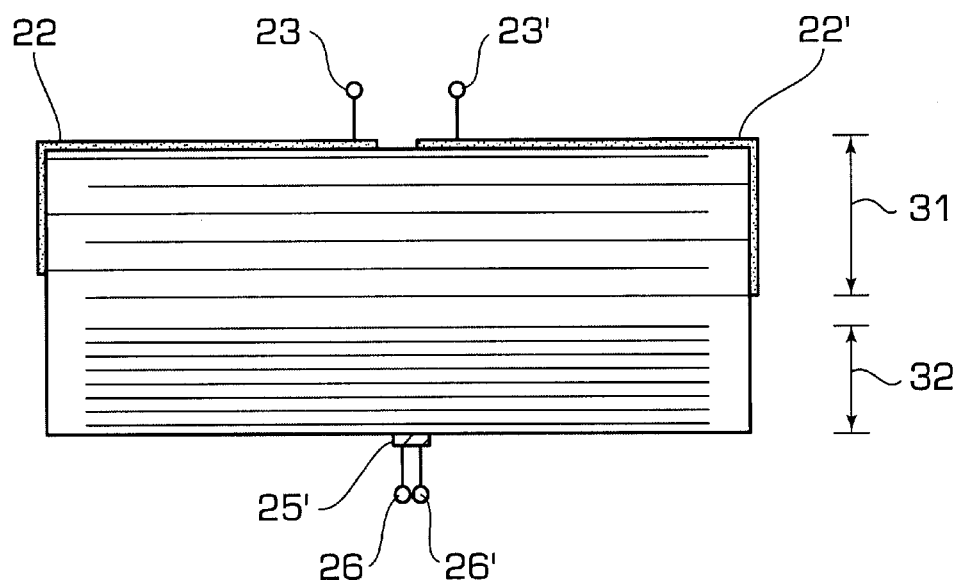

In the following, embodiments of the present invention are described with reference to the drawings. FIGS. 2 and 4 are views showing two embodiments of the present invention, respectively, and FIG. 2 shows an embodiment wherein a piezoelectric ceramic transformer is formed in a shape of a disk while FIG. 4 shows the other embodiment wherein a piezoelectric ceramic transformer is formed in a shape of a square plate.

Figure 1A:
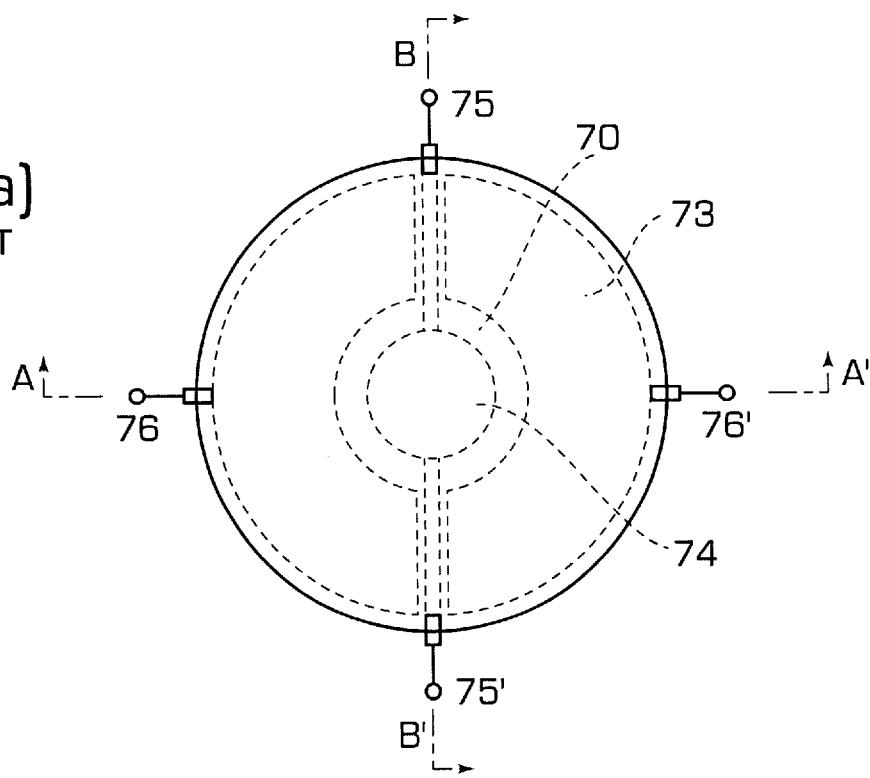
FIG. 1(a) is a plan view showing a construction of a conventional example of a piezoelectric ceramic transformer.
Figure 1B:
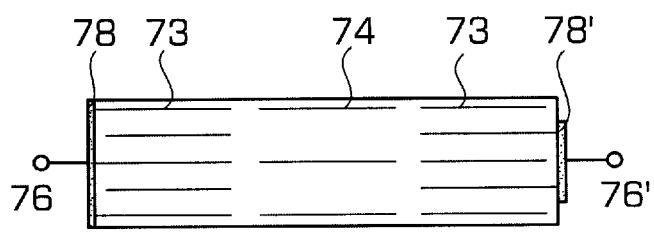
FIGS. 1(b) and 1(c) are sectional views taken along line A–A' and line B–B' of FIG. 1(a), respectively.
Figure 1C:
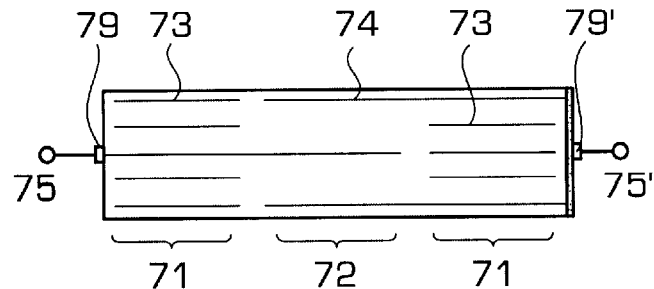
Figure 2A:
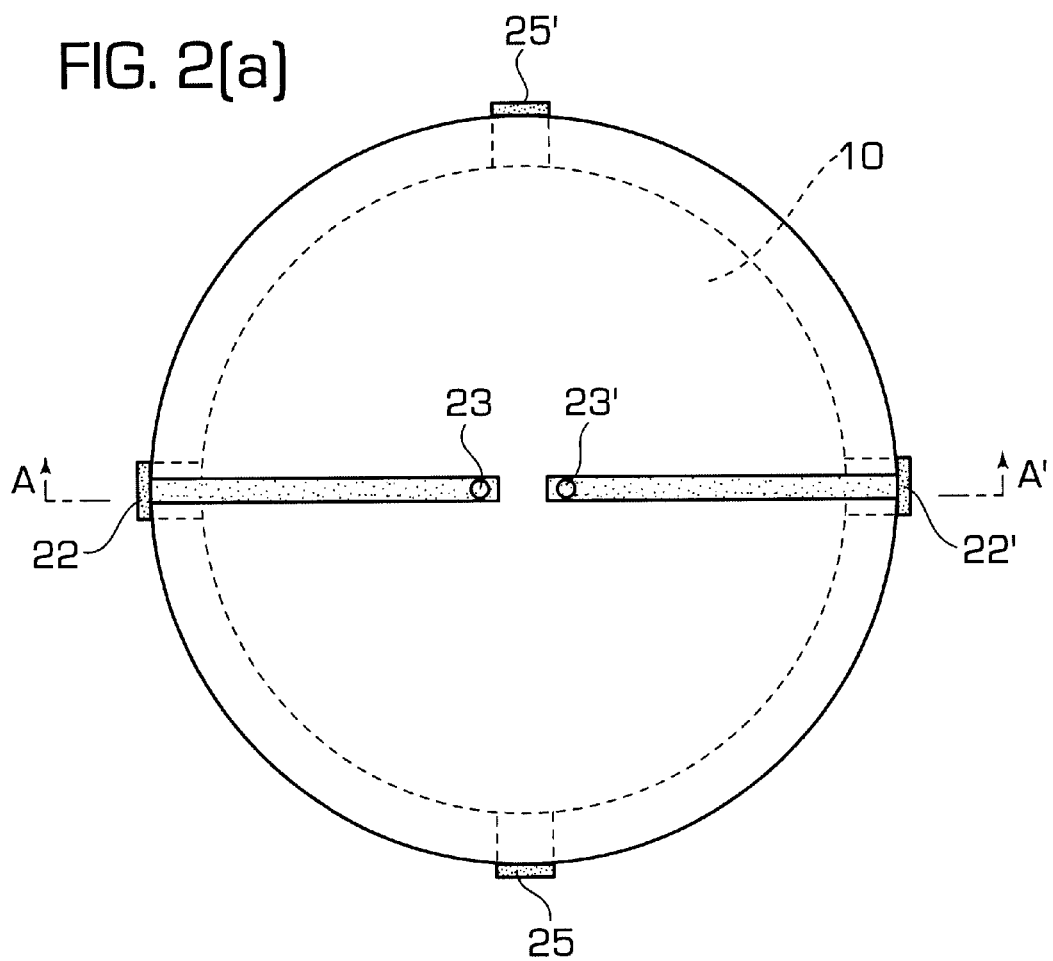
FIGS. 2(a) and 2(b) are a plan view and a sectional view, respectively, showing a piezoelectric ceramic transformer according to Embodiment 1.
Figure 2B:
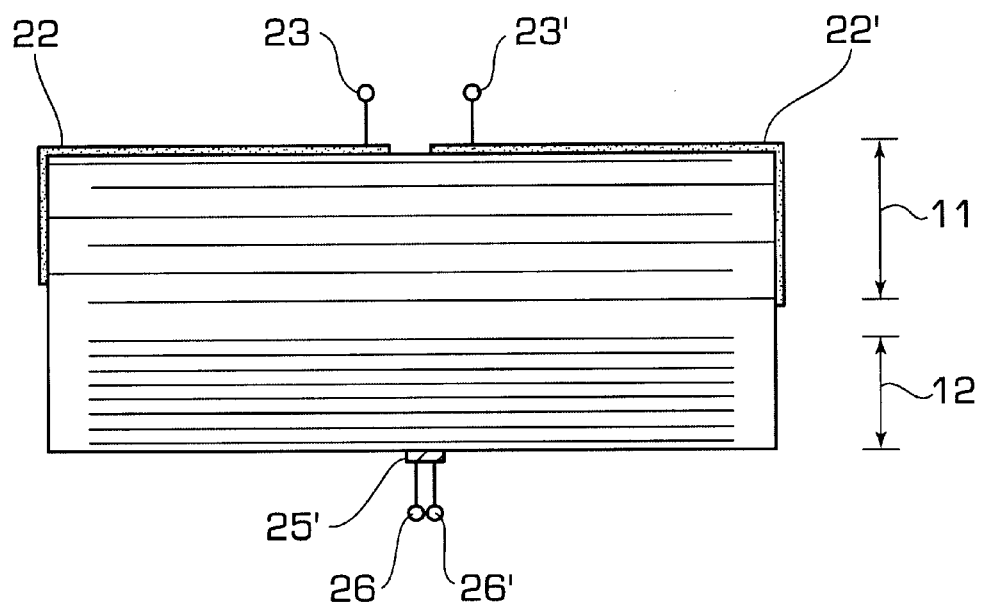

FIG. 2(a) shows a top plan view of the piezoelectric ceramic transformer, which generally has a shape of a disk. Meanwhile, FIG. 2(b) shows a sectional view taken along line A–A' of FIG. 2(a). Piezoelectric ceramic disk 10 is divided in a thickness direction into two portions which serve as driving part 11 and generating part 12.

Figure 3:
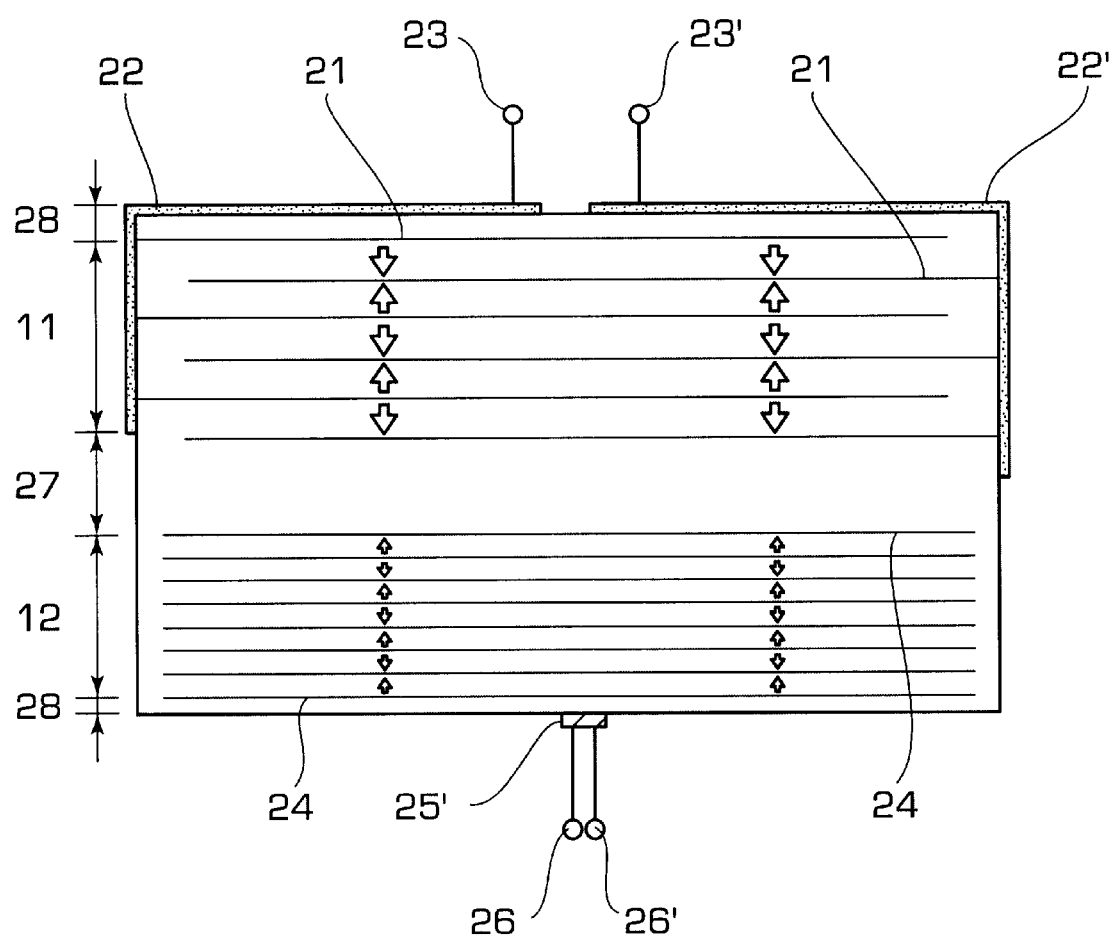
FIG. 3 is a sectional view of an inner electrode structure of the piezoelectric ceramic transformer of FIG. 2.

Details of the layered structure and the electrode construction of the piezoelectric ceramic transformer are shown in FIG. 3.

Circular inner electrodes 21 disposed in a spaced relationship from each other and extending in parallel to a top principal surface of driving part 11 are exposed, at every other ones thereof, to opposing different side end faces of piezoelectric ceramic disk 10 and are connected to each other on the side end faces individually by outer electrodes 22 and 22'. Further, the every other ones of inner electrodes 21 are led out to the top principal surface of piezoelectric ceramic disk 10 and connected to electronic terminals 23 and 23', respectively. Similarly, also circular inner electrodes 24 disposed in a spaced relationship from each other and extending in parallel to a bottom principal surface of generating part 12 are exposed, at every other ones thereof, to opposing side end faces of piezoelectric ceramic disk 10 displaced 90 degrees from those of driving part 11 and are connected to each other on the side end faces individually by outer electrodes 25 and 25'. Further, they are extracted to the bottom principal surface of piezoelectric ceramic disk 10 and connected to electronic terminals 26 and 26', respectively.

Each of driving part 11 and generating part 12 forms a layered structure wherein intermediate regions of inner electrodes 21 and 24 are polarized alternately in the opposite directions to each other in a thickness direction, and each arrow mark in FIG. 3 denotes the polarization direction of the layer. Insulating part 27 formed from a non-polarized piezoelectric ceramic layer is provided between driving part 11 and generating part 12. Insulating part 27 can be provided with a suitable thickness, and consequently, the creeping distance along the side surface between the driving part and the generating part of the piezoelectric ceramic transformer can be selected suitably. Further, the last layers between the top and bottom principal surfaces and inner electrodes 21 and 24 are formed as non-polarized parts 28 so as to establish isolation of the top and bottom main surfaces from inner electrodes 21 and 24 thereby to allow leading out of electronic terminals 23, 23', 26 and 26' from locations in the proximity of the centers of the top and bottom principal surfaces.

The reason why the outer electrodes are drawn around so that the leading out portions of electronic terminals 23, 23' and 26, 26' of driving part 11 and generating part 12 may be located at the central locations of the top principal surface and the bottom principal surface, respectively, is that it is intended to lead out them from positions at which they are influenced least by vibrations. The reason is that, in the piezoelectric ceramic transformer of the present invention, since it is operated in a radial direction expansion vibration basic mode, the outer side end faces serve as active parts (antinodes) of vibrations, and adhesion of the electronic terminals at the outer side end faces will give rise to a problem in reliability such as exfoliation.

Next, operation of the piezoelectric ceramic transformer of the present embodiment is described. The piezoelectric ceramic transformer of the present embodiment utilizes a basic mode of radial direction expansion vibrations. If a voltage is applied to driving part side electronic terminals 23 and 23' of the piezoelectric ceramic transformer in a frequency with which a radial direction expansion vibration basic mode is excited, then driving part 11 oscillates in a radial direction expansion vibration basic mode ($k_r$ mode) which relies upon an electromechanical coupling coefficient $k_r$. The vibrations are simultaneously transmitted to generating part 12 side and converted into electric energy, relying upon $k_r$, by generating part 12 side. Generally, electromechanical coupling coefficient $k_r$ of a piezoelectric ceramic material is higher by approximately twice than electromechanical coupling coefficient $k_{31}$ of longitudinal vibrations by a piezoelectric transversal effect, and an energy conversion coefficient is improved. Since the energy conversion efficiency is high, also the power transmission efficiency of the piezoelectric ceramic transformer is improved and also the volume of the piezoelectric ceramic transformer can be further reduced.

It is to be noted that, also where piezoelectric ceramic plate 30 has a square shape as seen in FIG. 4 and a basic mode of contour direction expansion vibrations is utilized, similar characteristics to those where piezoelectric ceramic plate 30 has a disk-like shape are achieved. In this instance, however, the electromechanical coupling coefficient of the contour direction expansion vibration mode is approximately 80% of and a little lower than electromechanical coupling coefficient $k_r$ of the radial direction expansion vibration mode of a disk and consequently has some influence on the energy conversion efficiency. However, the electromechanical coupling coefficient is still sufficiently high comparing with that of the longitudinal vibration mode by the piezoelectric transversal effect.

Figure 5A:
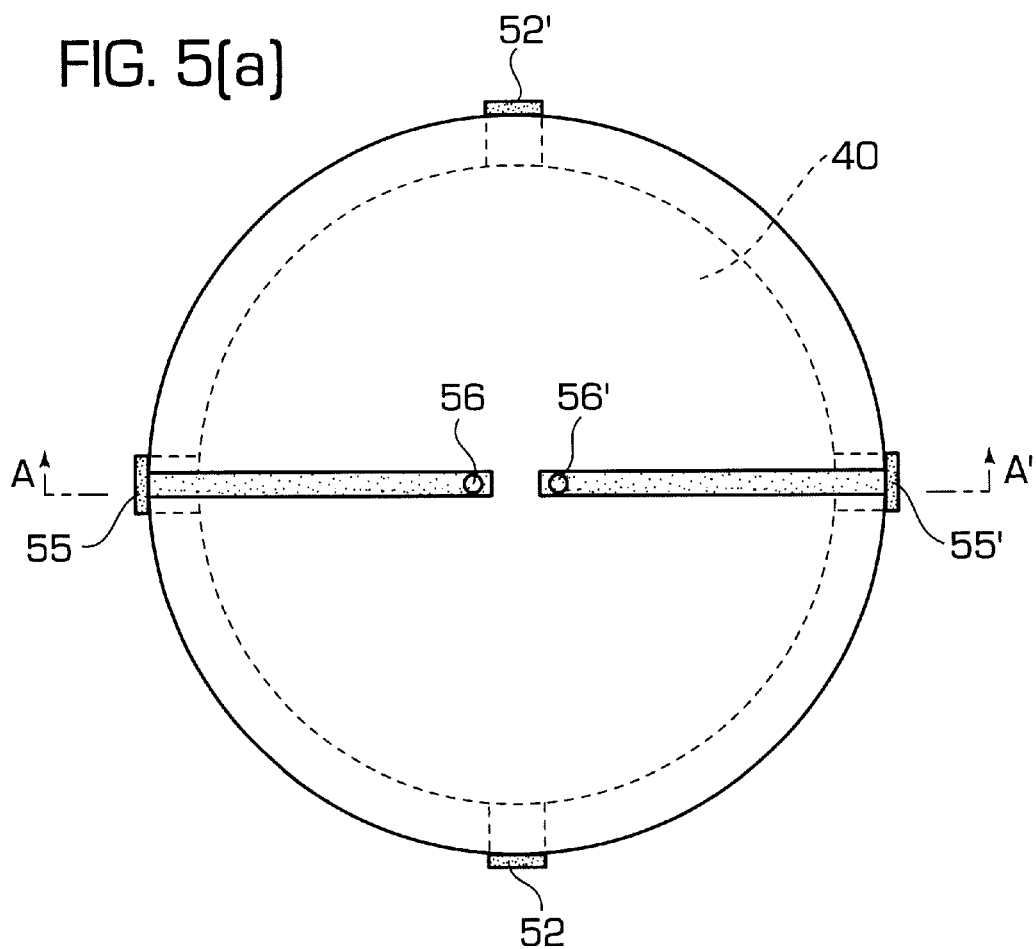
FIGS. 5(a) and 5(b) are a plan view and a sectional view, respectively, showing a piezoelectric ceramic transformer according to Embodiment 3.
Figure 5B:
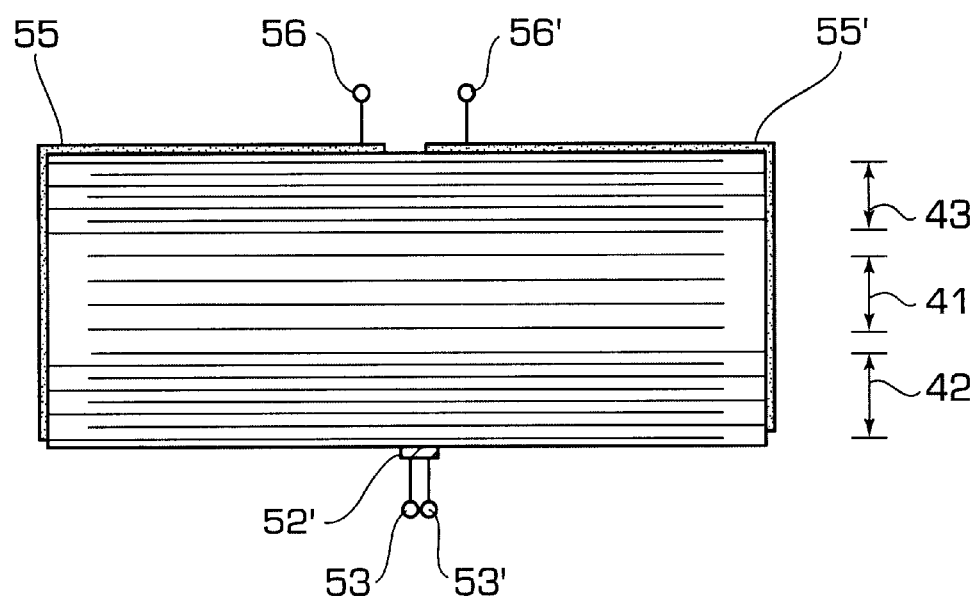
Figure 7A:
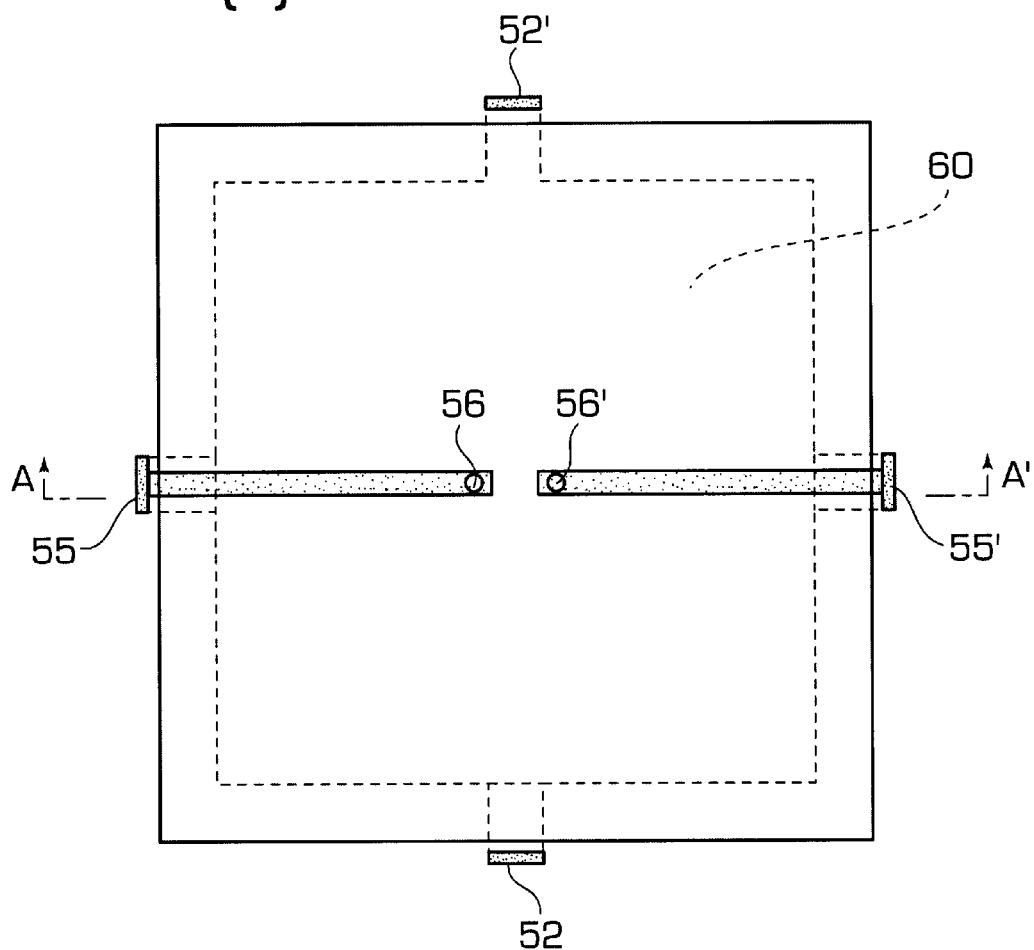
FIGS. 7(a) and 7(b) are a plan view and a sectional view, respectively, showing a piezoelectric ceramic transformer according to Embodiment 4.
Figure 7B:
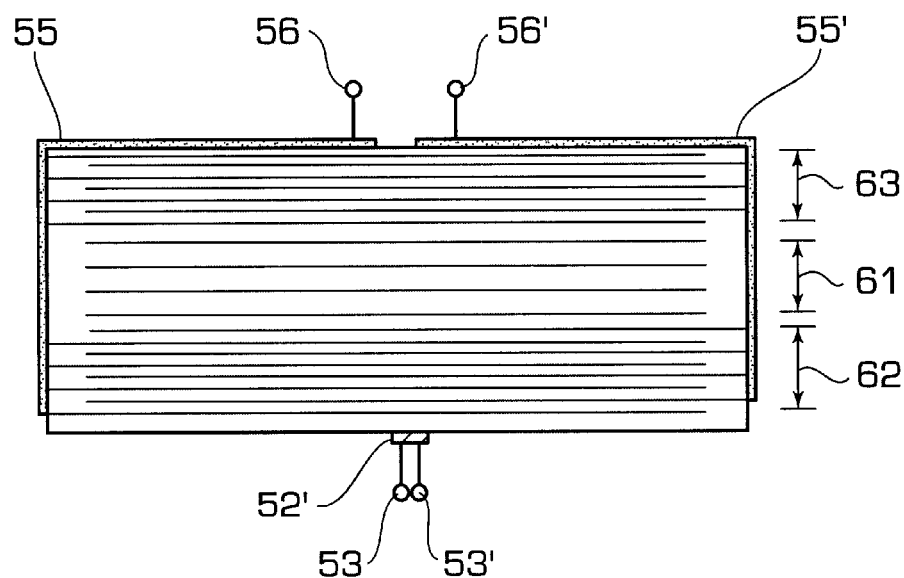

Next, further embodiments of different forms of the present invention are described with reference to the drawings. FIGS. 5 and 7 are views showing two embodiments of different forms. FIG. 5 shows an embodiment wherein a piezoelectric ceramic transformer is formed in a shape of a disk while FIG. 7 shows the other embodiment wherein a piezoelectric ceramic transformer is formed in a shape of a square plate. FIG. 5(a) shows a top plan view of a piezoelectric ceramic transformer similarly to FIG. 2(a) described hereinabove, and while the piezoelectric ceramic transformer generally has a shape of a disk, piezoelectric ceramic disk 40 is divided into three parts in a thickness direction such that it may have a symmetrical structure on a sectional plane at the center as seen in FIG. 5(b). The three parts are generating part 42, driving part 41 and generating part 43 from below.

Figure 6:
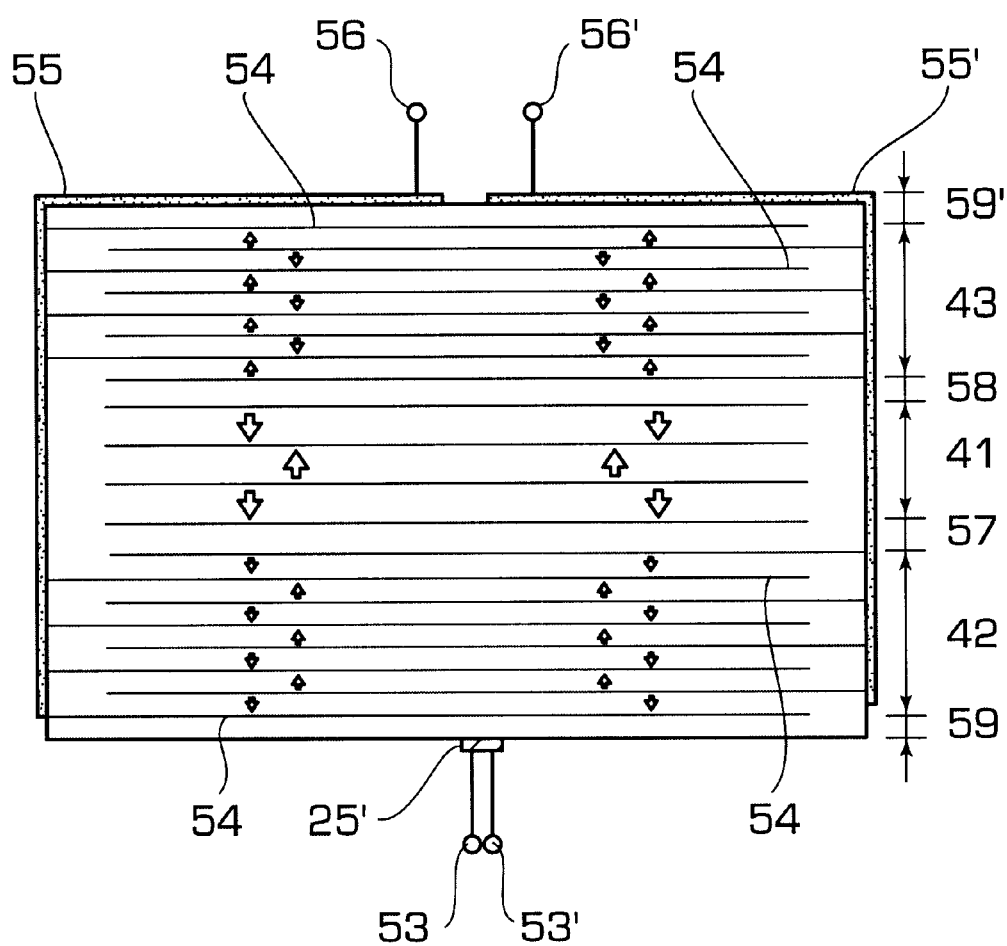
FIG. 6 is a sectional view of an inner electrode structure of the piezoelectric ceramic transformer of FIG. 5.

Details of the layer structure and the electrode structure are shown in FIG. 6.

Circular inner electrodes 51 disposed in a spaced relationship from each other and extending in parallel to piezoelectric ceramic disk 40 in driving part 41 are exposed, at every other ones thereof, to opposing side end faces of piezoelectric ceramic disk 40 and connected to each other on the side end faces individually by outer electrodes 52 and 52'. Further, they are led out to central locations of a bottom main face of piezoelectric ceramic disk 40 and connected to electronic terminals 53 and 53', respectively. Also inner electrodes 54 of generating part 42 and generating part 43 are exposed, at every other ones thereof, to opposing side end faces of piezoelectric ceramic disk 40 displaced by 90 degrees from those of driving part 41 and are connected to each other on the side end faces individually by outer electrodes 55 and 55'. Further, they are led out to a top principal surface of piezoelectric ceramic disk 40 and connected to electronic terminals 56 and 56', respectively.

Each of driving part 41 and two generating parts 42 and 43 has a layered structure in which the layers are alternately polarized in the opposite directions in a thickness direction, and in FIG. 6, each arrow mark indicates the polarization direction of the layer. Further, insulating parts 57 and 58 each formed from a non-polarized piezoelectric ceramic layer are provided between driving part 41 and generating parts 42 and 43, respectively. Each of insulating parts 57 and 58 can be formed with a suitable thickness and the creeping distances along the side end face between the driving part 41 and the generating parts 42 and 43 of the piezoelectric ceramic transformer can be selected suitably. Further, the last layers between the top and bottom principal surfaces and the inner electrodes are formed as non-polarized parts 59 and 59' to achieve isolation between the top and bottom principal surfaces and the inner electrodes thereby to allow leading out of electronic terminals 53, 53' and 56, 56' from locations in the proximity of the centers of the main surfaces.

The reason why the outer electrodes are drawn around so that the leading out portions of electronic terminals 53, 53' and 56, 56' of driving part 41 and generating part 42 may be located at the central locations of the top principal surface and the bottom principal surface, respectively, is that it is intended to lead out them from positions at which they are influenced least by vibrations. The reason is that, in the piezoelectric ceramic transformer of the present invention, since it is operated in a radial direction expansion vibration basic mode, the outer side end faces serve as active parts (antinodes) of vibrations, and adhesion of the electronic terminals at the outer side end faces will give rise to a problem in reliability such as exfoliation.

Next, operation of the piezoelectric ceramic transformer of the present embodiment is described. Also the piezoelectric ceramic transformer of the present embodiment utilizes a basic mode of radial direction expansion vibrations. If a voltage is applied to driving part side electronic terminals 53 and 53' of the piezoelectric ceramic transformer in a frequency with which a radial direction expansion vibration basic mode is excited, then driving part 41 vibrates in the radial direction expansion vibration basic mode ($k_r$ mode) which relies upon electromechanical coupling coefficient $k_r$. The vibrations are simultaneously transmitted to both of generating parts 42 and 43 sides and converted into electric energy, which relies upon electromechanical coupling coefficient $k_r$, by generating parts 42 and 43 sides. Generally, electromechanical coupling coefficient $k_r$ of a piezoelectric ceramic material is higher by approximately twice than electromechanical coupling coefficient $k_{31}$ of longitudinal vibrations by a piezoelectric transversal effect, and consequently, an energy conversion coefficient is improved. Since the energy conversion efficiency is high, also the power transmission efficiency of the piezoelectric ceramic transformer is improved and also the volume of the piezoelectric ceramic transformer can be reduced at the same time.

It is to be noted that, also where piezoelectric ceramic plate 60 has a shape of a square plate as seen in FIG. 7 and a basic mode of contour direction expansion vibrations is utilized, similar characteristics to those where piezoelectric ceramic plate 60 has a disk-like shape are achieved. In this instance, however, the electromechanical coupling coefficient of the contour direction expansion oscillation mode is approximately 80% of and a little lower than electromechanical coupling coefficient $k_r$ of the radial direction expansion vibration mode of a disk and consequently has some influence on the energy conversion efficiency. However, the electromechanical coupling coefficient is still sufficiently high comparing with that of the longitudinal vibration mode by the piezoelectric transversal effect.

Further, in the present invention, driving part 41 and generating parts 42, 43 have a symmetrical structure with respect to a central sectional plane in a thickness direction, and consequently, it is a significant characteristic that suppression of a bending vibration mode which makes a factor of a spurious response is achieved and bending vibrations are not excited. It is to be noted that, while the division of the driving part and the generating parts in the present embodiment is performed such that driving part 41 is held between generating parts 42 and 43 in a order of the generating part-driving part-generating part, similar effects can be obtained even if such a construction that a generating part is held between driving parts in a order of the driving part-generating part-driving part has a symmetrical structure in a thickness direction.

As a working example of a piezoelectric ceramic transformer according to the present invention, a piezoelectric ceramic transformer having such a construction as shown in FIG. 2 was produced. As a material for piezoelectric ceramic disk 10, a PZT ($PbZrO_3$-$PbTiO_3$) type piezoelectric ceramic plate was used. The size of piezoelectric ceramic disk 10 is 30 mm in diameter and 5 mm in thickness. Then, layering of the inner electrodes and the piezoelectric ceramic layers was performed using a known ceramic layering technique, and the driving part was formed from 5 ceramic layers, the generating part was formed from 7 ceramic layers and the diameter of the inner electrodes is 26 mm. In any adjacent piezoelectric ceramic layers, the polarization directions are opposite to each other as described above. The outer electrodes were formed on the top and bottom principal surfaces and the side end faces by screen printing and baking of Ag paste. The electrodes may alternatively be formed by formation of thin films of a conductive material other than Ag using a method other than the printing and baking method such as, for example, evaporation or sputtering. Thereafter, conductors were connected from the outer electrodes in the proximity of the center of the disk by soldering to form the electronic terminals.

The resonance frequency of the piezoelectric ceramic transformer in a radial direction expansion vibration basic mode was measured to be 75 kHz from a frequency characteristic of the admittance. A power transmission test was conducted with a load of 10 ohm connected to the piezoelectric ceramic transformer. As a result, an output power of 20 W (14 V/1.4 A) and a maximum energy conversion efficiency of 97% were obtained.

As a second working example of a piezoelectric ceramic transformer according to the present invention, a piezoelectric ceramic transformer of such a construction as shown in FIG. 4 was produced. As a material for the piezoelectric ceramic plate, a PZT ($PbZrO_3$-$PbTiO_3$) type piezoelectric ceramic plate was used. The size of piezoelectric ceramic plate 30 is 30 mm×30 mm. Then, layering of the inner electrodes and the piezoelectric ceramic layers was performed using a known ceramic layering technique, and the driving part was formed from 5 ceramic layers, and the generating part was formed from 7 ceramic layers. The inner electrodes have a margin of 1.5 mm from the outer side faces and have a size of 27 mm×27 mm. In any adjacent piezoelectric ceramic layers, the polarization directions are opposite to each other as described above. The outer electrodes are formed on the top and bottom principal surfaces and the side end faces by screen printing and baking of Ag paste. The electrodes may alternatively be formed by formation of thin films of a conductive material other than Ag using a method other than the printing and baking method such as, for example, evaporation or sputtering. Thereafter, conductors were connected from the outer electrodes in the proximity of the center of the disk by soldering to form the electronic terminals.

The resonance frequency of the piezoelectric ceramic transformer in a contour direction expansion vibration basic mode was measured to be 73 kHz from a frequency characteristic of the admittance. A power transmission test was conducted with a load of 10 ohm connected to the piezoelectric ceramic transformer. As a result, an output power of 20 W (14 V/1.4 A) and a maximum energy conversion efficiency of 96% were obtained.

As a third working example of a piezoelectric ceramic transformer according to the present invention, a piezoelectric ceramic transformer having such a construction as shown in FIG. 5 was produced. As a material for the piezoelectric ceramic disk, a PZT ($PbZrO_3$-$PbTiO_3$) type piezoelectric ceramic plate was used. The size of piezoelectric ceramic disk 40 is 30 mm in diameter and 7 mm in thickness. Then, layering of inner electrodes 51 and 54 and piezoelectric ceramic disk 40 was performed using a known ceramic layering technique, and driving part 41 was formed from 3 ceramic layers, each of two generating parts 42 and 43 was formed from 7 ceramic layers and the diameter of the inner electrodes is 26 mm. In any adjacent piezoelectric ceramic layers, the polarization directions are opposite to each other as described above. Outer electrodes 52, 52' and 55, 55' were formed on the top and bottom principal surfaces and the side end faces by screen printing and baking of Ag paste. The electrodes may alternatively be formed by formation of thin films of a conductive material other than Ag using a method other than the printing and baking method such as, for example, evaporation or sputtering. Thereafter, conductors were connected from the outer electrodes in the proximity of the center of the disk by soldering to form electronic terminals 53, 53' and 56, 56'.

The resonance frequency of the piezoelectric ceramic transformer in a radial direction expansion vibration basic mode was measured to be 74 kHz from a frequency characteristic of the admittance. A power transmission test was conducted with a load of 10 ohm connected to the piezoelectric ceramic transformer. As a result, an output power of 20 W (14 V/1.4 A) and a maximum energy conversion efficiency of 97% were obtained. Further, in a frequency range lower than 150 kHz, a spurious response caused by a bending mode or the like was not observed.

As a fourth working example of a piezoelectric ceramic transformer according to the present invention, a piezoelectric ceramic transformer of such a construction as shown in FIG. 7 was produced. As a material for the piezoelectric ceramic plate, a PZT ($PbZrO_3$-$PbTiO_3$) type piezoelectric ceramic plate was used. The size of piezoelectric ceramic plate 60 was 30 mm×30 mm×7 mm. Then, layering of the inner electrodes and the piezoelectric ceramic layers was performed using a known ceramic layering technique, and driving part 61 was formed from 3 ceramic layers, and each of two generating parts 62 and 63 was formed from 7 ceramic layers. The inner electrodes have a margin of 1.5 mm from the outer side face and have the size of 27 mm×27 mm. In any adjacent piezoelectric ceramic layers, the polarization directions are opposite to each other as described above. The outer electrodes are formed on the top and bottom principal surfaces and the side end faces by screen printing and baking of Ag paste. The electrodes may alternatively be formed by formation of thin films of a conductive material other than Ag using a method other than the printing and baking method such as, for example, evaporation or sputtering. Further, conductors were connected from the outer electrodes in the proximity of the center of the disk by soldering to form the electronic terminals.

The resonance frequency of the piezoelectric ceramic transformer in a contour direction expansion vibration basic mode was measured to be 71 kHz from a frequency characteristic of the admittance. A power transmission test was conducted with a load of 10 ohm connected to the piezoelectric ceramic transformer. As a result, an output power of 20 W (14 V/1.4 A) and a maximum energy conversion efficiency of 96% were obtained. Further, in a frequency range up to approximately 1.5 times (110 kHz) as high as the resonance frequency, a spurious response caused by a bending mode or the like was not observed.

Although certain preferred embodiments of the present invention have been shown and described in detail, it should be understood that various changes and modifications may be made therein without departing from the scope of the appended claims.

What is claimed is:

1. A piezoelectric ceramic transformer comprising:
  a piezoelectric ceramic plate having an outer shape of a disk, wherein:
    said piezoelectric ceramic plate is divided, where circular surfaces of said piezoelectric ceramic plate are defined as principal surfaces, in a thickness direction into two regions parallel to said principal surfaces and one of said two regions is formed as a driving part while the other region is formed as a generating part, and each of said driving part, and said generating part forms a layering structure which comprises a plurality of inner electrode pairs formed in parallel to said principal surfaces and opposing each other in the thickness direction and regions between the inner electrodes, said regions between the inner electrodes being polarized so that any adjacent ones of said inner electrodes may have opposite polarization directions to each other;
    an intermediate region between said driving part and said generating part is set as a non-polarized insulating layer; and
    the inner electrodes which oppose each other are partially exposed to different side end faces of said piezoelectric ceramic plate so that the polarities thereof may be opposite to each other and alternately connected to each other by outer electrodes and further connected to respective electronic terminals, said piezoelectric ceramic transformer being driven in a radial direction expansion vibration basic mode.

2. A piezoelectric ceramic transformer as claimed in claim 1, wherein said outer electrodes fitted on said side end faces are individually led out to locations in the proximity of the centers of the top and bottom principal surfaces of said piezoelectric ceramic plate, and electric leads are led out from the locations.

3. A piezoelectric ceramic transformer comprising:
  a piezoelectric ceramic plate having an outer shape of a square plate, wherein:
    said piezoelectric ceramic plate is divided, where square surfaces of said piezoelectric ceramic plate are defined as principal surfaces, in a thickness direction into two regions parallel to said principal surfaces and one of said two regions is formed as a driving part while the other region is formed as a generating part, and each of said driving part and said generating part forms a layering structure as a whole which comprises a plurality of inner electrode pairs formed in parallel to said principal surfaces and opposing each other in the thickness direction and regions between the inner electrodes, said regions between the inner electrodes being polarized so that any adjacent ones of said inner electrodes may have opposite polarization directions to each other;
    an intermediate region between said driving part and said generating part is set as a non-polarized insulating layer; and
    the inner electrodes which oppose each other are partially exposed to different side end faces of said piezoelectric ceramic plate so that the polarities thereof may be opposite to each other and are alternately connected to each other by outer electrodes and further connected to respective electronic terminals, said piezoelectric ceramic transformer is driven in a profile direction expansion vibration basic mode.

4. A piezoelectric ceramic transformer as claimed in claim 3, wherein said outer electrodes fitted on said side end faces are individually led out to locations in the proximity of the centers of the top and bottom principal surfaces of said piezoelectric ceramic plate, and electric leads are led out from the locations.

5. A piezoelectric ceramic transformer comprising:
  a piezoelectric ceramic plate having an outer shape of a disk, wherein:
    said piezoelectric ceramic plate is divided, where circular surfaces of said piezoelectric ceramic plate are defined as principal surfaces, in a thickness direction into three regions parallel to said principal surfaces and each having a symmetrical structure with respect to center sectional plane and a central one of said three regions is formed as either a driving part or a generating part while the regions on the opposite sides of said central region are formed as either generating parts or driving parts different from that of said central region, and each of said driving part or parts and said generating parts or part forms a layering structure as a whole which comprises a plurality of inner electrode pairs formed in parallel to said principal surfaces and opposing each other in the thickness direction and regions between the inner electrodes, said regions between the inner electrodes being polarized so that any adjacent ones of said inner electrodes may have opposite polarization directions to each other;
    intermediate regions between said driving part or parts and said generating parts or part are set as non-polarized insulating layers; and
    adjacent ones of the inner electrodes which oppose each other are partially exposed to different side end faces of said piezoelectric ceramic plate so that the polarities thereof may be opposite to each other and are alternately connected to each other by outer electrodes and further connected to respective electronic terminals, said piezoelectric ceramic transformer is driven in a radial direction expansion vibration basic mode.

6. A piezoelectric ceramic transformer as claimed in claim 5, wherein said outer electrodes fitted on said side end faces are individually led out to locations in the proximity of the centers of the top and bottom principal surfaces of said piezoelectric ceramic plate, and electric leads are led out from the locations.

7. A piezoelectric ceramic transformer comprising:
  a piezoelectric ceramic plate having an outer shape of a square plate, wherein:
    said piezoelectric ceramic plate is divided, where square surfaces of said piezoelectric ceramic plate are defined as principal surfaces, in a thickness direction into three regions parallel to said principal surfaces and each having a symmetrical structure with respect to a center sectional plane and a central one of said three regions is formed as either a driving part or a generating part while the regions on the opposite sides of said central region are formed as either generating parts or driving parts different from that of said central region, and each of said driving part or parts and said generating parts or part forms a layering structure as a whole which comprises a plurality of inner electrode pairs formed in parallel to said principal surfaces and opposing each other in the thickness direction and regions between the inner electrodes, said regions between the inner electrodes being polarized so that any adjacent ones of said inner electrodes may have opposite polarization directions to each other;

intermediate regions between said driving part or parts and said generating parts or part are set as non-polarized insulating layers; and adjacent ones of the inner electrodes which oppose each other are partially exposed to different side end faces of said piezoelectric ceramic plate so that the polarities thereof may be opposite to each other and are alternately connected to each other by outer electrodes and further connected to respective electronic terminals, said piezoelectric ceramic transformer is driven in a contour direction expansion vibration basic mode.

8. A piezoelectric ceramic transformer as claimed in claim 7, wherein said outer electrodes fitted on said side end faces are individually led out to locations in the proximity of the centers of the top.

* * * * *

UNITED STATES PATENT AND TRADEMARK OFFICE
CERTIFICATE OF CORRECTION

PATENT NO. : 6,573,638 B1  Page 1 of 1
DATED : June 3, 2003
INVENTOR(S) : Mitsuru Yamamoto It is certified that error appears in the above-identified patent and that said Letters Patent is hereby corrected as shown below:

Column 12,
Line 13, after "top" insert -- and bottom principal surfaces of said peizoelectric ceramic plate, and electric leads are led out from the locations --

Signed and Sealed this

Thirteenth Day of January, 2004

JON W. DUDAS
*Acting Director of the United States Patent and Trademark Office*